United States Patent
Liang et al.

(10) Patent No.: US 7,790,477 B2
(45) Date of Patent: Sep. 7, 2010

(54) APPARATUS AND METHOD FOR CLEANING GLASS SUBSTRATES USING A COOL HYDROGEN FLAME

(75) Inventors: David Tee Liang, Singapore (SG); Tuti Mariana Lim, Singapore (SG); Sau Ngen Chen, Singapore (SG)

(73) Assignee: Agency For Science, Technology And Research, Singapore (SG)

( * ) Notice: Subject to any disclaimer, the term of this patent is extended or adjusted under 35 U.S.C. 154(b) by 27 days.

(21) Appl. No.: 12/366,660

(22) Filed: Feb. 6, 2009
(Under 37 CFR 1.47)

(65) Prior Publication Data
US 2009/0188534 A1 Jul. 30, 2009

Related U.S. Application Data

(62) Division of application No. 10/495,973, filed on Feb. 1, 2005, now Pat. No. 7,504,267.

(51) Int. Cl.
*H01L 21/00* (2006.01)
*A61L 2/00* (2006.01)
(52) U.S. Cl. .............. 438/4; 438/906; 422/38; 257/E21.226
(58) Field of Classification Search .............. None
See application file for complete search history.

(56) References Cited

U.S. PATENT DOCUMENTS

| | | | | |
|---|---|---|---|---|
| 2,011,872 A | * | 8/1935 | Rava | 219/75 |
| 3,514,036 A | * | 5/1970 | Smith, Sr. et al. | 239/85 |
| 4,271,022 A | * | 6/1981 | Dixon et al. | 210/198.2 |
| 4,368,063 A | * | 1/1983 | Presby | 65/42 |
| 4,370,060 A | * | 1/1983 | Murase et al. | 356/417 |
| 4,995,960 A | * | 2/1991 | Wiles et al. | 204/418 |
| 2003/0051738 A1 | * | 3/2003 | Cigada et al. | 134/1 |
| 2004/0173316 A1 | * | 9/2004 | Carr | 156/345.41 |
| 2004/0173579 A1 | * | 9/2004 | Carr | 219/121.4 |
| 2004/0173580 A1 | * | 9/2004 | Carr | 219/121.4 |
| 2005/0061774 A1 | * | 3/2005 | Kelley et al. | 216/67 |
| 2005/0061782 A1 | * | 3/2005 | Chang et al. | 219/121.41 |
| 2005/0061783 A1 | * | 3/2005 | Kelley et al. | 219/121.41 |
| 2005/0184034 A1 | * | 8/2005 | Carr | 219/121.48 |

* cited by examiner

*Primary Examiner*—Jarrett J Stark
(74) *Attorney, Agent, or Firm*—Pyprus Pte Ltd

(57) ABSTRACT

Contaminants from surfaces of temperature sensitive substrates, such as glass substrates are removed by exposing the surfaces to a hydrogen Surface-mixed diffusion flame for a predetermined duration of time. The predetermined duration of time being insufficient to heat up the surfaces substantially thereby causing damage to the temperature sensitive substrates.

9 Claims, 3 Drawing Sheets

APPARATUS AND METHOD FOR CLEANING GLASS SUBSTRATES USING A COOL HYDROGEN FLAME

CROSS REFERENCE TO RELATED APPLICATION

This application is a divisional application of U.S. utility patent application Ser. No. 10/495,973 filed on Nov. 20, 2002.

FIELD OF THE INVENTION

The present invention relates in general to the surface cleaning of glass substrates for Flat Panel Displays. More particularly, the present invention relates to an apparatus and method for using a cool hydrogen flame for surface cleaning of glass substrates for manufacturing of Flat Panel Displays.

BACKGROUND OF THE INVENTION

Flat panel displays (FPDs) are well known devices commonly used in industrial and consumer devices. The most common FPDs are the Liquid Crystal Displays (LCDs) and the Plasma Display Panels (PDPs). The FPDs have relatively small footprints as compared to Cathode Ray Tube (CRT) displays. They consume less energy. The images produced are not distorted at the edges. FPDs are currently used in almost every field of technology that requires a graphic display. They are fast replacing CRT monitors as the de facto output peripheral for personal computers. FPDs are also displacing the conventional CRT television sets.

One of the important elements of the FPDs is the glass substrates which are used to make the viewable screen of the displays. The quality requirements of such glass substrates are very high. They have to be of high clarity, high degree of flatness, uniform thickness and free from contaminants. These glass substrates are now manufactured in large pieces measuring about 890 mm by 680 mm with a thickness of about 0.7 mm. They are later cut into smaller pieces for their various applications.

FPD manufacturers often rely on service providers to perform the cleaning task and to deliver the ready-to-use glass substrates according to their requirements to reduce their overhead costs. The typical standard of cleanliness that is required of glass substrates of the size 890 mm by 680 mm is approximately 15,000 particles of size 0.3 micron.

In a glass substrate cleaning plant, the manufactured glass substrates are delivered in packages of 10-12, held together by four slotted angles made from urethane foam in order to protect each glass substrate from another. The surface of these glass substrates at this stage is highly contaminated. The contaminants range from small general particulate matter like dust to other organic compounds and protein matter. Some of these organic compounds and protein matter can be attributed to human handling and can include natural oils from the skin or simply put "fingerprints".

The washing or cleaning of glass substrates in the manufacturing of FPDs is crucial. It ensures that the surfaces of the glass substrates are free from contaminants. This is necessary for the proper coating requirements according to the different types of FPDs. The importance of cleaning the glass substrates is basically to ensure the clarity of the images produced when the FPDs are finally assembled. Contaminants present on the surfaces of the glass substrates prevent proper coating and causes distortion.

Some of the possible approaches or methods used in cleaning glass substrates are: high temperature de-ionized water, the Radiance Process®, High Power Ultrasonic cleaning and Plasma cleaning.

The currently most practiced method of cleaning glass substrates is to first wash them with high temperature de-ionized (DI) water, followed by vacuum drying. The glass substrates are then conveyed directly into a clean room environment for packaging. This method though somewhat effective, consumes several million cubic meters of DI water for a typical production process. The use of vacuum drying also increases costs, as power requirements are also very high. Studies have indicated that a plant cleaning 5000 FPD parts a day would require about 1.44 cubic meters of DI water per FPD part. This washing method also becomes less effective when the particulate size approaches 0.3 microns.

The Radiance Process® makes use of a laser and a continuous laminar flow of an inert gas to remove contaminants. The laser breaks the bonds holding the contaminants to the glass substrate and the inert gas carries the contaminants away. Recent demonstrations have shown that the total particulate counts were reduced dramatically. However, the Radiance Process® is highly dependent on maintaining the laminar flow of inert gases over the glass substrate surface. The equipment to provide and carry out this Radiance Process® is presently not available at a low cost.

Another method used is High Power Ultrasonic cleaning. The technology itself is not new. Ultrasonic cleaning has already been used with Printed Circuit Boards. It has been applied here in the cleaning of glass substrates as well. However, the method is far from perfect. During the ultrasonic cleaning process, cavitation of the cleaning fluid results in formation of small bubbles impacting onto the surface of the glass substrates. This sometimes causes micro-fractures on the glass surface and renders the glass substrate unusable.

Plasma Cleaning technology is performed in high vacuum systems by exposing the parts to be cleaned to energized plasmas. Though effective, plasma systems require high sources of energy to energize the plasmas and to provide the high vacuum environments. Invariably, such a system might be too expensive to use merely on account of cleaning the surfaces of a glass substrate.

There is thus a need for a novel, effective and economical method and apparatus for removing of contaminants from surfaces of glass substrates.

SUMMARY OF THE INVENTION

The present invention seeks to provide a method and apparatus for cleaning glass substrates using a cool hydrogen flame.

Contaminants from surfaces of temperature sensitive substrates, such as glass substrates are removed by exposing the surfaces to a hydrogen Surface-mixed diffusion flame for a predetermined duration of time. The predetermined duration of time being insufficient to heat up the surfaces substantially thereby causing damage to the temperature sensitive substrates.

In a first aspect, the present invention provides a method for removing contaminants from surfaces of temperature sensitive substrates, the method comprising the steps: producing a hydrogen Surface-mixed diffusion flame, and exposing the hydrogen Surface-mixed diffusion flame to the surfaces for a predetermined duration of time, the predetermined duration of time being insufficient to heat up the surfaces substantially thereby causing damage to the temperature sensitive substrates.

In another aspect, the present invention provides a process for cleaning surfaces of a glass substrate, the process comprising the steps: washing the glass substrate with de-ionized water, drying the glass substrate, producing a hydrogen Surface-mixed diffusion flame; and exposing the hydrogen Surface-mixed diffusion flame to the surfaces for a predetermined duration of time, the predetermined duration of time being insufficient to heat up the glass substrate substantially thereby causing damage to the glass substrate.

In a further aspect, the present invention further provides a system for cleaning surfaces of a glass substrate for manufacturing Flat Panel Displays, the system comprising: a jig for securely holding the glass substrate, a conveying means for transporting the jig, a washing unit using de-ionized water for cleaning the glass substrate, a drying unit, and a cleaning chamber using Hydrogen surface-mixed diffusion flame.

DETAILED DESCRIPTION OF THE DRAWINGS

Figure 1:
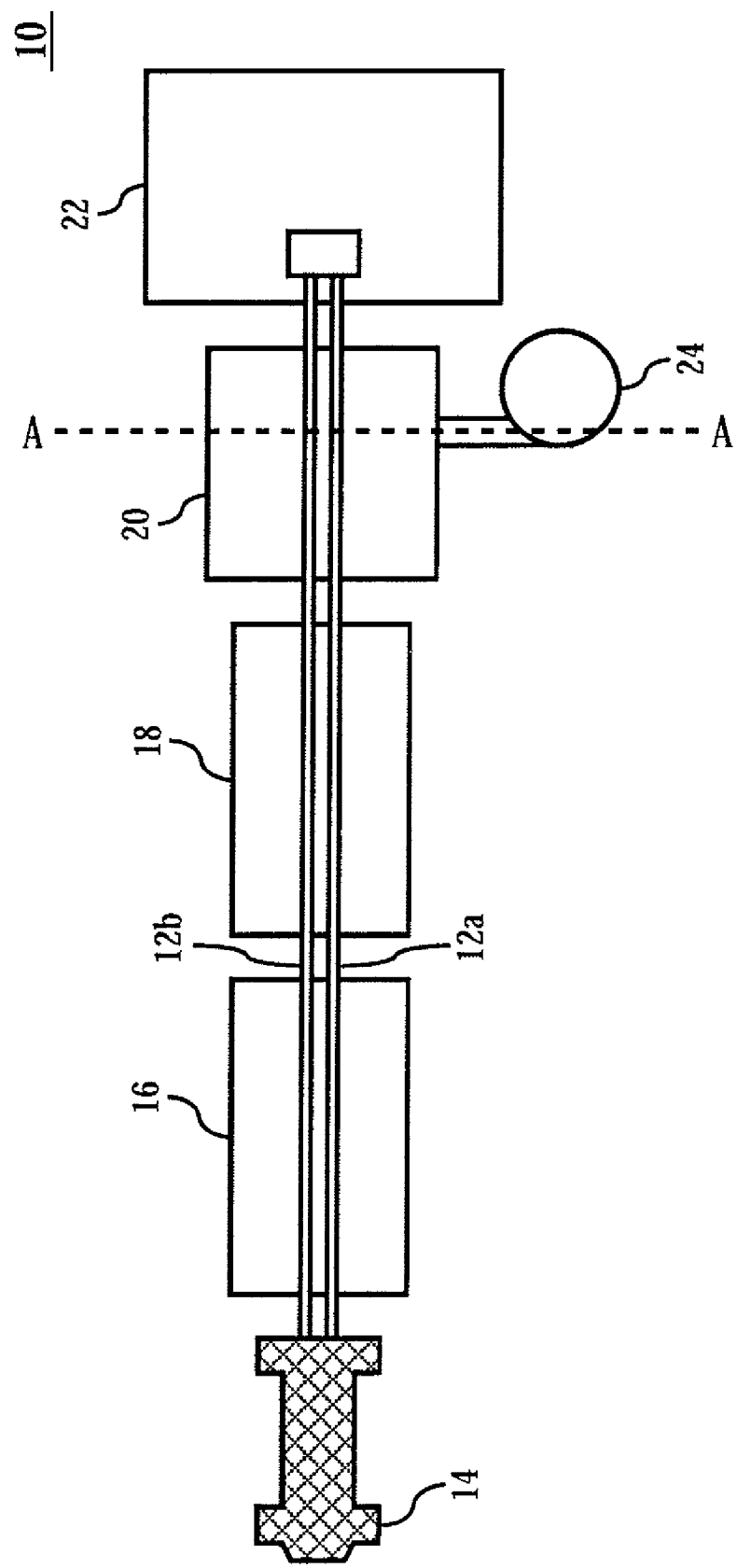
FIG. 1 shows a top elevation plan view of the layout of the apparatus according to the present invention.

FIG. 1 shows a system 10 according to the present invention for the cleaning of glass substrates for the manufacture of FPDs. The system 10 comprises of conveying means 12a, 12b, a jig 14, a DI water tank 16, a drying chamber 18, a Hydrogen cleaning chamber 20 and a clean-room packaging facility 22. The Hydrogen cleaning chamber 20 is designed to be a vacuum chamber. It operates at an internal pressure of about 3 psi or 0.2 bar. To achieve this a vacuum pump 24 is used.

Figure 2:
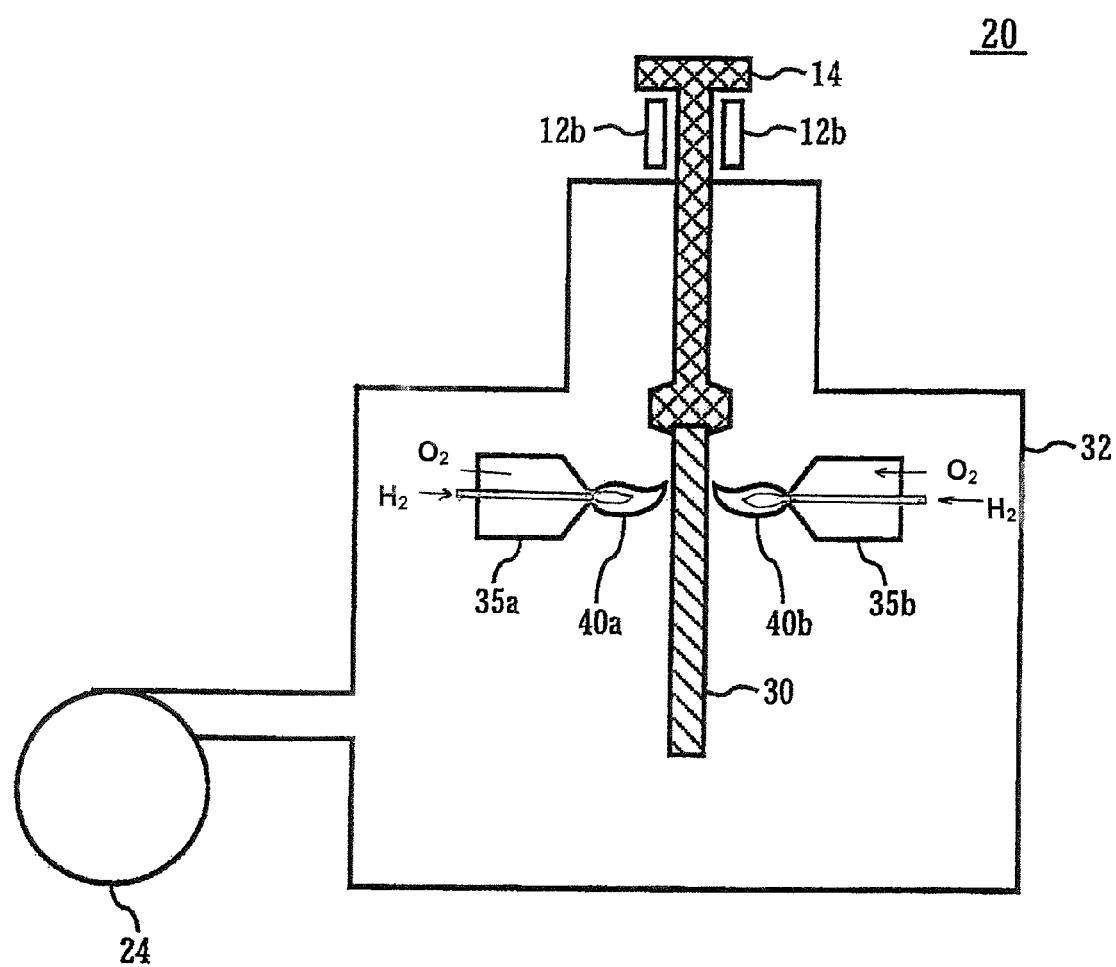
FIG. 2 shows a right side cross-sectional view of the Hydrogen Flame Chamber according to section A-A of FIG. 1.

Referring to FIG. 2, the Hydrogen cleaning chamber 20 comprises a stainless steel chamber 32, the vacuum pump 24 and a pair of Hydrogen Burner Hubs 35a,35b. The jig 14 holds a glass substrate 30 in a position substantially equidistant from the two Hydrogen Burner Hubs 35a,35b.

The Hydrogen Burner Hubs 35a/35b are made up of a plurality of linearly arranged burner nozzles. The length of the Hydrogen Burner Hub is about that of the length of the glass substrate to be cleaned. The flames produced by the burner nozzles are gentle, "cool" and clean burning. They are produced by burning pure hydrogen in pure oxygen.

However, the hydrogen and oxygen are not pre-mixed before being ignited. Instead, the burner nozzle is of a tube in orifice design. That is to say, a main nozzle ejecting oxygen gas, and a central nozzle positioned inside the main nozzle ejecting hydrogen gas. When the burner nozzle is in operation, hydrogen gas is being ejected with an envelope of oxygen gas surrounding it. When this hydrogen gas is ignited, it burns only at the envelope of the hydrogen and oxygen gas interface. This produces a flame referred to as a Surface-mixed Diffusion Flame 40a,40b. It can be described as a "cool" burning flame as its temperature is much lower than the conventional pre-mixed flames. To ensure complete combustion of the hydrogen gas, a 100% excess of oxygen is ejected from the nozzles. Since the Hydrogen cleaning chamber 20 is a vacuum chamber operating at about 3 psi, there is no opportunity for the gases to accumulate even if they are not used up.

Figure 3:
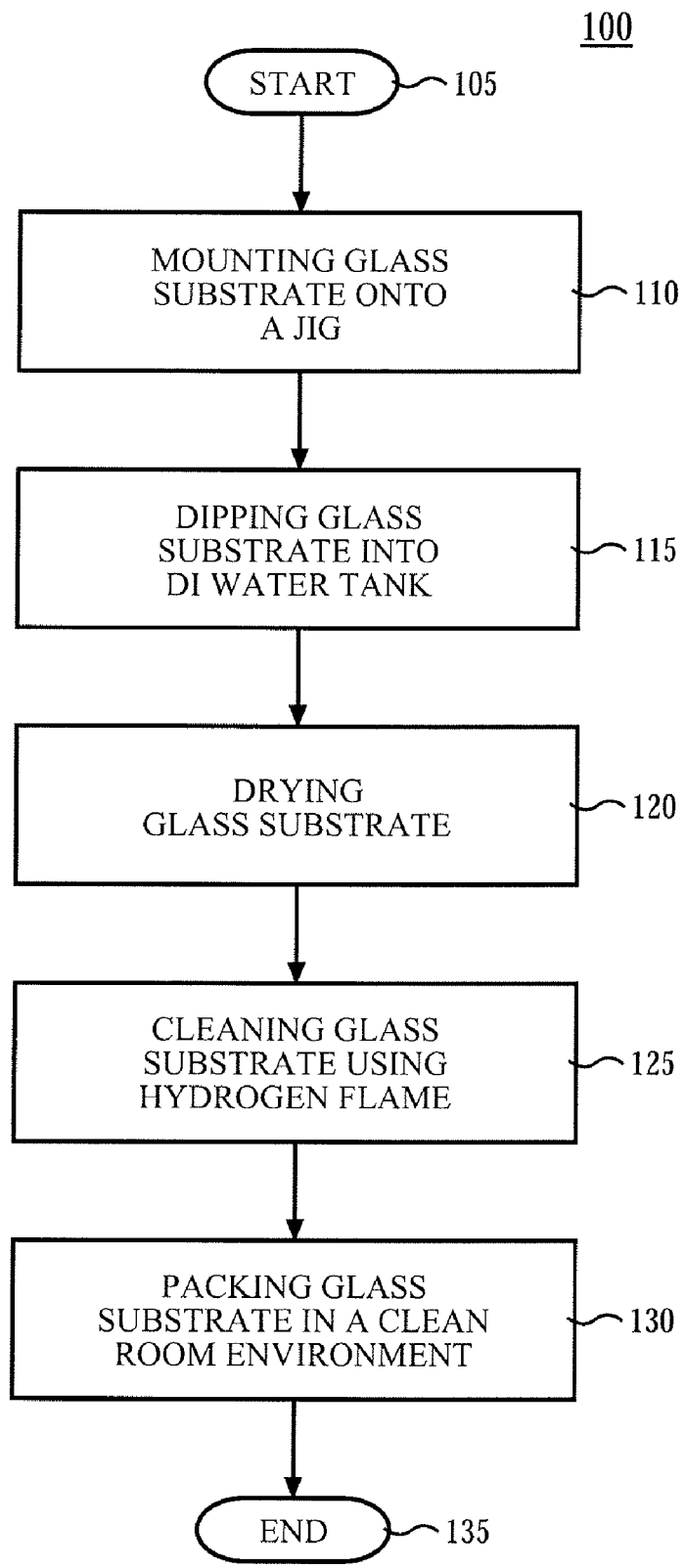
FIG. 3 shows a block diagram illustrating the steps of cleaning the glass substrates according to the present invention.

Referring to FIG. 1 and FIG. 3, the steps of the process 100 of cleaning a glass substrate 30 starts with the mounting 110 of the glass substrate 30 onto a jig 14. The glass substrate 30 is then conveyed to a DI water tank 16. The glass substrate 30 is lowered or dipped 115 into the DI water tank for an initial washing. Any soluble contaminants and loose particulate matter would be removed here. The glass substrate 30 is then raised and conveyed to the drying chamber 18 for drying 120. Compressed air or dry steam is used to blow or displace any moisture on the glass substrate 30. This also aids in removal of other particulate matter. The glass substrate is then conveyed to the Hydrogen Flame chamber 20 for the final surface cleaning of the glass substrate using Hydrogen Flame 125. Referring to FIG. 2, the Hydrogen Burner Hubs 35a,35b are situated at a level near the top of the glass substrate 30 as it enters the Hydrogen Flame Chamber 20. The Hydrogen Burner Hubs 35a,35b have already been ignited The Surface-mixed Diffusion Flame 40a, 40b are just in contact with the surfaces near the top of the glass substrate 30. The jig 14 is then raised vertically allowing the flames to come into contact with the rest of the glass substrate 30. In effect, the flames are being gently swept over the entire surfaces of the glass substrate 30. The flames are "swept" over the surfaces at a rate of about 20 mm per second. This results in any contaminants being vaporized from the surfaces of the glass substrate. At this rate, such a system could very well clean a single glass substrate in less than a minute, close to 1500 units in a single 24 hour day.

In this present system, it is the glass substrate that is being moved, while the burners remain stationery. It is also entirely possible, to have the glass substrate remain stationery while the burners are being articulated or even having both being articulated in a manner to ensure that the entire surfaces of the glass substrate are "swept".

The cleaned glass substrate 30 is then immediately conveyed into a clean-room packaging facility 22. The glass substrate 30 is then packaged 130 in an inert gas to protect it from contamination and increase its electrical stability. A process which is also known as passivation. The glass substrates are now ready for delivery to the FPD manufacturers.

Using hydrogen flames for the clean vaporization of contaminants is by no means a new technology. However, the product to be cleaned is a 890 mm by 680 mm glass substrate with a thickness of about 0.7 mm. A conventional pre-mixed hydrogen flame would simply be too hot. The glass substrate of such a large area would simply warp and lose its flatness and clarity. If a pre-mixed flame was kept at a further distance, it would simply not vaporized the contaminants. Only the Surface-mixed Diffusion flame is "cool" enough to be exposed directly to the glass substrate and yet still be able to vaporize the contaminants.

Furthermore, the well known properties of hydrogen flames is its clean-burning effect which does not produce soot or carbon particles like most hydrocarbon flames. The absence of soot during combustion also significantly reduces the radiative heat release by hydrogen flames thus making it a "cool" flame. In addition, radicals produced during hydrogen combustion are extremely reactive and will effectively destroy and remove organic contaminants quickly.

To further increase the performance of the present invention, chemicals additives are introduced into the system 10 to enhance the cleaning process of the present invention. Chemicals additives such as hydrogen peroxide and ozone can increase the presence of radicals in the system 10 and consequently increase the performance of the cleaning of the glass substrate 30 as radicals readily react with the organic contaminants effectively destroying them.

Ozone is introduced into the DI water tank 16 such that the DI water used is ozonized. The strong oxidizing properties of ozone in the DI water is highly effective in removal of any organic contaminants on the glass substrates 30. The ozone can be introduced into the DI water tank 16 by at least one gas nozzle introduced into the DI water tank 16. Correspondingly, the process 100 in accordance with the present invention would further comprise an additional step of introducing ozone into the DI water tank 16 before the glass substrate 30 is dipped into the DI water tank 16 for initial washing. Washing the glass substrate 30 in ozonized DI water further enhances the performance of the hydrogen cleaning chamber 20.

In addition to the Surface-mixed Diffusion flame vaporizing the contaminants on the glass substrates 30; radicals produced during combustion of hydrogen further ensure that organic contaminants present would be eliminated. This can further be enhanced by the additional introduction of hydrogen peroxide into the hydrogen cleaning chamber 20.

Hydrogen peroxide is introduced into the Hydrogen Cleaning Chamber 20 in the from of a fine mist by a plurality of spray nozzles. The spray nozzles are preferably located near the Hydrogen Burner Hubs 35a/35b and oriented such that the spray nozzles are pointing at the glass substrate being cleaned as well as the Surface-mixed Diffusion flame 40a, 40b. The spray nozzles could also be arranged such that the spray nozzles are co-axial to the Hydrogen Burner Hubs 35a/35b. The fine mist of hydrogen peroxide directed at the glass substrate 30 being cleaned results in more hydroxyl radicals being formed as the hydrogen peroxide dissociates due to the heat generated by the Surface-mixed Diffusion flame 40a,40b. Any water formed as a result of the dissociation of the hydrogen peroxide is converted into steam by the Surface-mixed Diffusion flame 40a,40b and removed by the vacuum pump 24. The fine mist of hydrogen peroxide is also directed at the glass substrate 30 to also help in cooling the temperature of the glass substrate 30 to prevent any overheating which may result in the glass substrate 30 warping due to the heat from the Surface-mixed Diffusion flame 40a,40b. Correspondingly, the process 100 in accordance with the present invention further comprises an additional step of spraying a fine mist of hydrogen peroxide directed at the glass substrate 30. This spraying of fine mist of hydrogen peroxide occurs simultaneously with the cleaning of the glass substrate 30 using the Surface-mixed Diffusion flame 40a,40b.

Alternatively, ozone is introduced into the Hydrogen Cleaning Chamber 20 to enhance the performance of the present invention. The ozone is introduced into the Hydrogen Cleaning Chamber 20 via a plurality of gas nozzles. The gas nozzles would be sited away from the Hydrogen Burner Hubs 35a,35b but directed towards the glass substrate 30 after the glass substrate has undergone the cleaning process by the Surface-mixed Diffusion. The ozone is directed at the glass substrate 30 just before it is conveyed to the clean-room packaging facility 22. The introduced ozone dissociates to form oxygen radicals and oxygen gas. The radicals aid further in the elimination of any remaining contaminants on the glass substrate 30 before the glass substrate 30 is packaged 130.

Furthermore, the process 100 of cleaning the glass substrate 30 would further comprise an additional step of directing ozone gas at the glass substrates 30 after the step of cleaning using Hydrogen Flame 125 and before the step of packaging 130 the glass substrate 30.

This method of using a Surface-mixed Diffusion flame advantageously overcomes the shortcomings of the other methods of cleaning. It uses much less water, less power consumption and does not require expensive equipment. This method does not induce additional mechanical stress on the glass substrate and does not compromise the quality requirements of the FPD manufacturers. The gases required are easily available and do not constitute a high cost. Some of the more stubborn contaminants like "fingerprints" comprising of natural oils and organic matter are easily removed compared to when using hot DI water.

The above description according to one example of the invention does not in any way limit the scope of the invention. It would be apparent to one skilled in the art that the present invention may be modified or used in or with other types of temperature sensitive substrates without departing from the scope of the invention.

What is claimed is:

1. A system for cleaning surfaces of a glass substrate for manufacturing Flat Panel Displays, said system comprising:
    a jig for securely holding said glass substrate;
    a conveying means for transporting said jig;
    a washing unit using de-ionized water for cleaning said glass substrate;
    a drying unit;
    a cleaning chamber using hydrogen diffusion flame wherein the hydrogen diffusion flame is produced by burning hydrogen and oxygen at an interface formed by an envelope of oxygen surrounding the hydrogen, wherein: the hydrogen and oxygen are not pre-mixed before being ignited; and said hydrogen diffusion flame generates radicals to react with contaminants on said glass substrate for removing said contaminants; and
    at least one nozzle for spraying fine mist of hydrogen peroxide towards said hydrogen diffusion flame.

2. The system according to claim 1, wherein said cleaning chamber is a vacuum chamber.

3. The system according to claim 1, wherein said system further comprises a clean room for passivating and packaging said glass substrate.

4. The system according to claim 1, wherein pressure within said cleaning chamber is about 0.2 bar.

5. The system according to claim 1, wherein said cleaning chamber comprises a plurality of burner nozzles producing a plurality of hydrogen diffusion flames.

6. The system according to claim 1, wherein said plurality of burner nozzles are capable of controlled movement in a predetermined fashion.

7. The system according to claim 1, wherein said plurality of burner nozzles are of the tube in orifice design.

8. The system according to claim 1, wherein the oxygen is at least 100% more than the hydrogen.

9. The system according to claim 1, wherein said cleaning chamber further comprises at least one nozzle introducing ozone gas towards said glass substrate.

* * * * *